(12) United States Patent
Shirokoshi

(10) Patent No.: US 7,173,315 B2
(45) Date of Patent: Feb. 6, 2007

(54) SEMICONDUCTOR DEVICE

(75) Inventor: Hideki Shirokoshi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/248,213

(22) Filed: Oct. 13, 2005

(65) Prior Publication Data

US 2006/0086999 A1    Apr. 27, 2006

(30) Foreign Application Priority Data

Oct. 26, 2004    (JP)    ............................. 2004-310769

(51) Int. Cl.
*H01L 29/00*    (2006.01)
(52) U.S. Cl. ...................... 257/500; 257/503; 257/516; 257/E29.012
(58) Field of Classification Search ................ 257/500, 257/503, 516, E29.012
See application file for complete search history.

(56) References Cited

U.S. PATENT DOCUMENTS 5,892,268 A * 4/1999 Yashita et al. ............... 257/544

6,525,392 B1 * 2/2003 Leonardi ..................... 257/500
2005/0082632 A1 * 4/2005 Kanda et al. ............... 257/500

FOREIGN PATENT DOCUMENTS

JP    07-135299    5/1995

* cited by examiner

*Primary Examiner*—T. N. Quach
(74) *Attorney, Agent, or Firm*—McDermott Will & Emery LLP

(57) ABSTRACT

In a semiconductor device in which a control circuit region and a power transistor region are formed, a first dummy region is formed between a ground side transistor composing a push-pull circuit and the control circuit region while a second dummy region is formed between the ground side transistor and the end part of a semiconductor substrate. The first and second dummy regions have a conductive type different from that of the semiconductor substrate. The second dummy region is connected electrically to a part of the semiconductor substrate between the ground side transistor and the first dummy region.

12 Claims, 10 Drawing Sheets

SEMICONDUCTOR DEVICE

CROSS REFERENCE TO RELATED APPLICATIONS

This Non-provisional application claims priority under 35 U.S.C. § 119(a) on Patent Application No. 2004-310769 filed in Japan on Oct. 26, 2004, the entire contents of which are hereby incorporated by reference. The entire contents of Patent Application No. 2005-270139 filed in Japan on Sep. 16, 2005 are also incorporated by reference.

BACKGROUND ART

The present invention relates to a semiconductor device, and particularly relates to a semiconductor device in which an output circuit and a control circuit for controlling the output circuit are provided on a substrates.

In the case where an inductive load such as a motor, a coil, or the like is driven by switching by a drive circuit (a power transistor), back electromotive force is generated immediately after the direction of a drive current for switching the inductive load changes, resulting in decrease in potential of an output terminal of the drive circuit lower than the ground potential. When the potential of an output terminal of a semiconductor device including such a drive circuit becomes lower than the ground potential, a parasitic transistor in the semiconductor device operates. The parasitic transistor is not a transistor actually formed as an active circuit element but a transistor formed unintentionally in the case where an additional semiconductor region is present next to one semiconductor region in a semiconductor device. For example, when N-type regions are adjacent to each other on a P-type semiconductor substrate, a parasitic NPN transistor is formed. In this case, when the potential of one of the N-type regions becomes negative to allow the parasitic NPN transistor to turn ON, the other N-type region serves as a collector of the parasitic NPN transistor to cause a parasitic current to flow.

When the parasitic transistor operates as above, an abnormal parasitic current flows in a part other than the paths for the essential circuit currents in the semiconductor substrate, inviting malfunction of the drive circuit integrated within the semiconductor device.

For tackling the above disadvantages caused by the parasitic transistor, there is a technique disclosed in Japanese Patent Application Laid Open Publication No. 7-135299A, for example. The technique disclosed in this document will be explained with reference to FIG. 9 and FIG. 10.

FIG. 10 is a plan view schematically showing a structure of a semiconductor device in the above document. On the surface of a semiconductor chip 201 shown in FIG. 10, there are provided a large signal section 202 in which a power transistor is formed, a small signal section 203 in which a control circuit for controlling the power transistor is formed, and a dummy island 204 formed between the large signal section 202 and the small signal section 203. The dummy island 204 is connected to an external power source Vcc.

FIG. 9 is a view schematically showing in section the essential part of the semiconductor device shown in FIG. 10. The semiconductor device is a bipolar semiconductor device fabricated in such a manner that an n-type epitaxial layer 205 is formed on a p-type semiconductor substrate 206, the epitaxial layer 205 is divided by forming a p+-type isolation region 207 to form multiple islands, and elements are formed in each island. Reference numeral 208 denotes an n+-type buried layer. An NPN transistor is formed as a power transistor by forming a p-type base region 213 and forming an n+-type emitter region 214 thereon in the surface portion of an island with the island used as a collector. An n+-type region 209a is formed so as to extend from the surface of the epitaxial layer 205 to the n+-type buried layer 208. This n+-type region 209a is connected to an output terminal (OUT).

FIG. 9 also shows a parasitic transistor Q generated in the semiconductor chip 201. The parasitic transistor Q is a lateral transistor using an island (collector) in which the power transistor is formed as an emitter, the semiconductor substrate 206 as a base, and the n+-type region 209b in the dummy island 204 as a collector.

Malfunction that may be caused in the semiconductor device disclosed in the aforementioned document will be explained below with reference to FIG. 9. When the power transistor switches to drive the inductive load such as a motor, a phenomenon occurs in which supply of the current from the output terminal (OUT) to the inductive load is halted. The inductive load has a characteristic that the current therein continues to flow even when the current supply is interrupted. In this connection, the current flows through a path from the semiconductor substrate 206 to the collector of the power transistor and then to the inductive load even after the current supply is halted. At that time, the potential of the output terminal (OUT) becomes negative lower than the ground potential, so that the semiconductor substrate 206 and the collector of the power transistor are forward biased. Accordingly, the forward diode voltage is applied between the base and the emitter of the parasitic transistor Q to allow the parasitic transistor Q to turn ON.

The parasitic transistor Q can be considered as a combination of two parasitic transistors which share the islands (collector) of the power transistor as an emitter, share the semiconductor substrate 206 as a base, and use the n+-type region 209b in the dummy island 204 and the epitaxial layer 205 in the control circuit as the collectors.

The external power source Vcc is connected to the dummy island 204, so that almost all part (i1) of the collector current of the parasitic transistor Q is supplied from the external power source Vcc thereto the dummy island 204. The supply of the parasitic collector current i1 from the external power source Vcc reduces a parasitic collector current i2 of the parasitic transistor Q using the control circuit as a collector, thereby suppressing malfunction of the control circuit. The technique disclosed in the aforementioned document attains reduction in parasitic collector current i2, which influences the control circuit, to 1/10 to 1/20 of that of a device with no dummy island 204.

Further, the aforementioned parasitic preventing method cannot reduce the parasitic current sufficiently, and another method for suppressing the parasitic current in which arrangement of the power transistor is devised has been employed in combination. Specifically, the power source side power transistor in which no parasitic transistor is generated is arranged between the control circuit and a ground side power transistor to minimize the current amplification (hFE) of the parasitic transistor (see the above document).

SUMMARY OF THE INVENTION

In the recent years, however, circuit designs in which the circuit operation current in the control circuit of the small signal section 203 is set small are widely employed for reducing power consumption of electronic equipment, and accordingly, the control circuit is liable to receive influence of the parasitic current. Under the circumstances, the parasitic current must be reduced further and an effect of reduction in parasitic current obtained by the parasitic current preventing method as in the above conventional technique has become insufficient. Thus, further reduction in parasitic current is demanded earnestly.

Moreover, the n-type dummy island 204 is connected to the external power source Vcc, so that the parasitic collector current of the parasitic transistor Q contributes to a consumption current (a power source current) of the semiconductor device to increase the consumption current, thereby restraining reduction of the consumption power of the semiconductor device.

The present invention has been made in view of the above problems and has its object of providing a semiconductor device that prevents a parasitic transistor, which invites malfunction of a control circuit, from turning ON even when negative potential is induced at an output terminal.

A semiconductor device of the present invention includes: a semiconductor substrate; an output circuit formed in the semiconductor substrate; and a control circuit formed in the semiconductor substrate for controlling the output circuit, the output circuit including at least one pair of a ground side transistor and a power source side transistor which compose a push-pull circuit, first and second dummy regions having a different conductive type from that of the semiconductor substrate being formed in the semiconductor substrate with the ground side transistor interposed, the first dummy region being located between the ground side transistor and the control circuit, and the second dummy region being connected electrically to a part of the semiconductor substrate between the ground side transistor and the first dummy region. The push-pull circuit includes a circuit generally called a totem-pole circuit. Further, it is preferable to electrically connect the second dummy region to the part of the semiconductor substrate between the ground side transistor and the first dummy region by means of a wiring formed on the semiconductor substrate.

In the above semiconductor device, a part of the semiconductor substrate between the second dummy region and the ground side transistor may be grounded.

In the above semiconductor device, it is preferable that the grounded part of the semiconductor substrate between the second dummy region and the ground side transistor has higher impurity concentration than the other part of the semiconductor substrate.

In the above semiconductor device, it is preferable that the part of the semiconductor substrate between the ground side transistor and the first dummy region is not grounded.

It is preferable that the output circuit is located between the control circuit and an end part of the semiconductor substrate and the ground side transistor and the power source side transistor are arranged in a row along the end part of the semiconductor substrate.

It is preferable that the semiconductor substrate is in a rectangular shape, the pair of the ground side transistor and the power source side transistor includes a plurality of pairs thereof, and all of the ground side transistors and the power source side transistors are arranged in a row along one side of the semiconductor substrate.

It is preferable that the output circuit is formed substantially in a rectangular shape on the semiconductor substrate, the control circuit is formed in an L-shape and is arranged so as to be adjacent to two sides of the output circuit, and one of two sides of the control circuit adjacent to the output circuit is adjacent to the power source side transistor while the ground side transistor and the power source side transistor are arranged in a row along the other side of the control circuit.

In a preferred embodiment, at least one of a resistance element and a capacitor element is provided in a region of the control circuit adjacent to the output circuit, and potential of the region is set equal to potential of a power source or a ground.

PREFERRED EMBODIMENTS OF THE INVENTION

Figure 1:
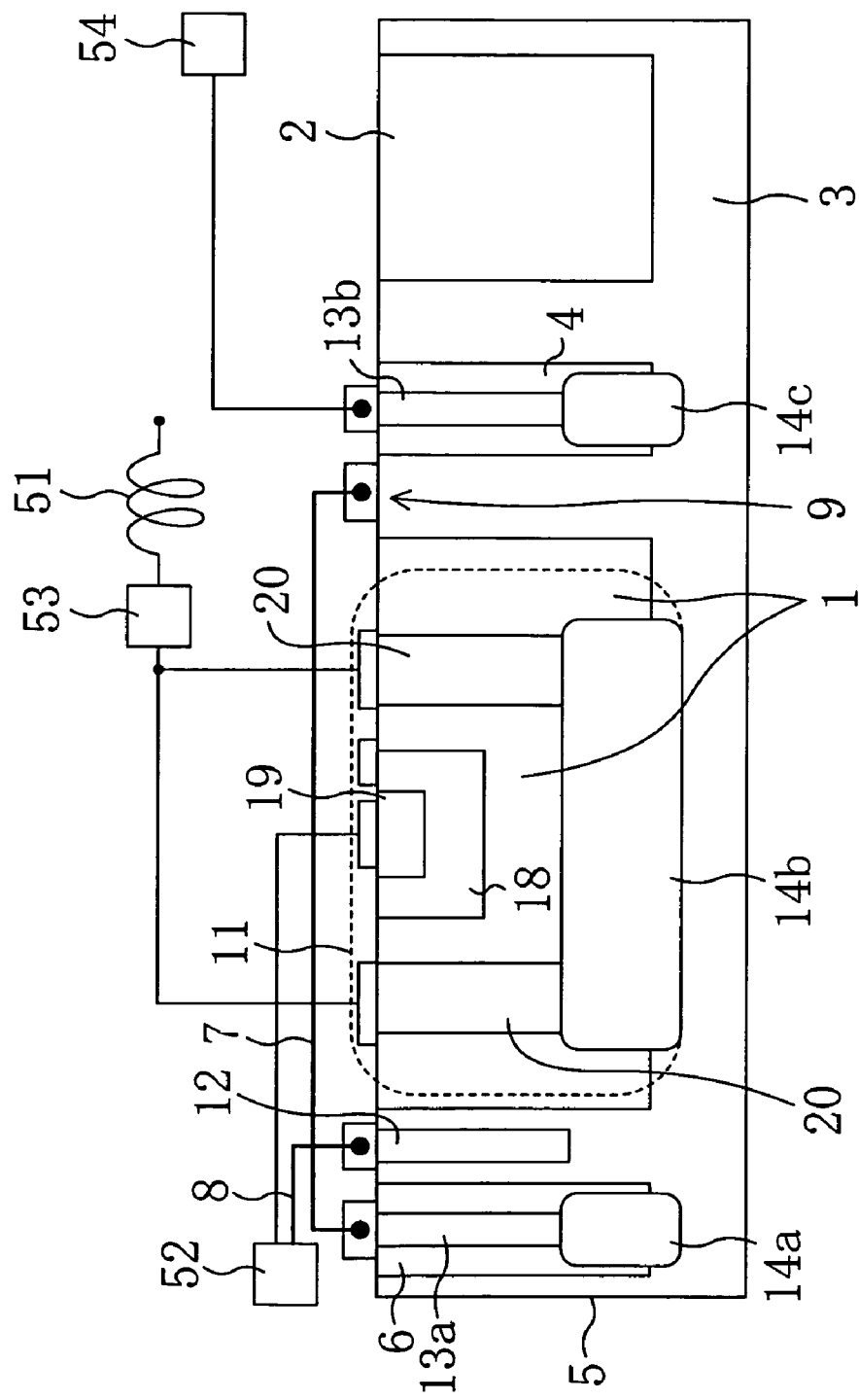
FIG. 1 is a schematic section of a semiconductor device according to Embodiment 1.

The embodiments of the present invention will be described below with reference to the accompanying drawings. For the sake of simplicity, the same reference numerals are assigned to the constitutional elements having substantially the same functions.

(Embodiment 1)

Figure 2:
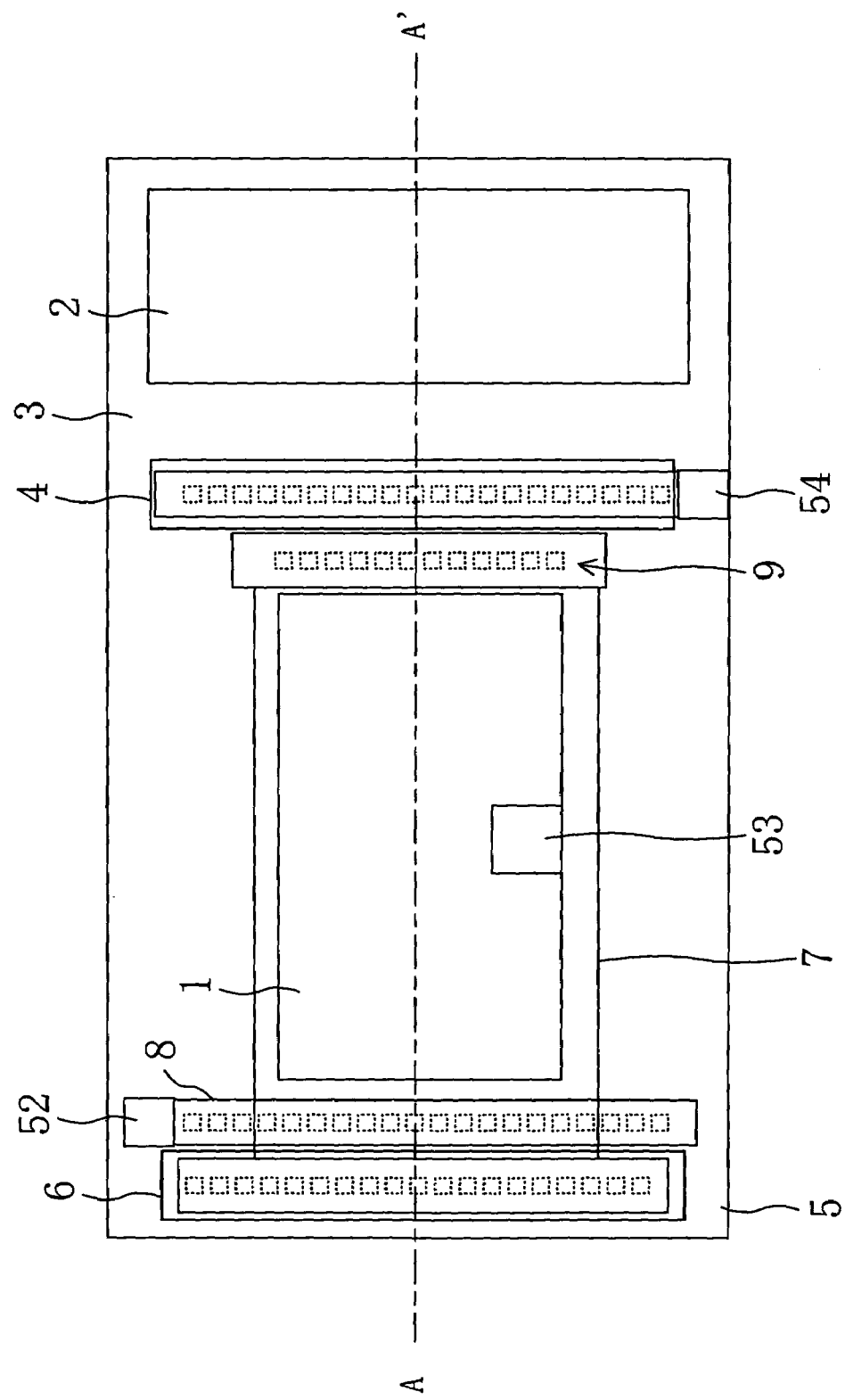
FIG. 2 is a schematic plan view of the semiconductor device according to Embodiment 1.
Figure 3:
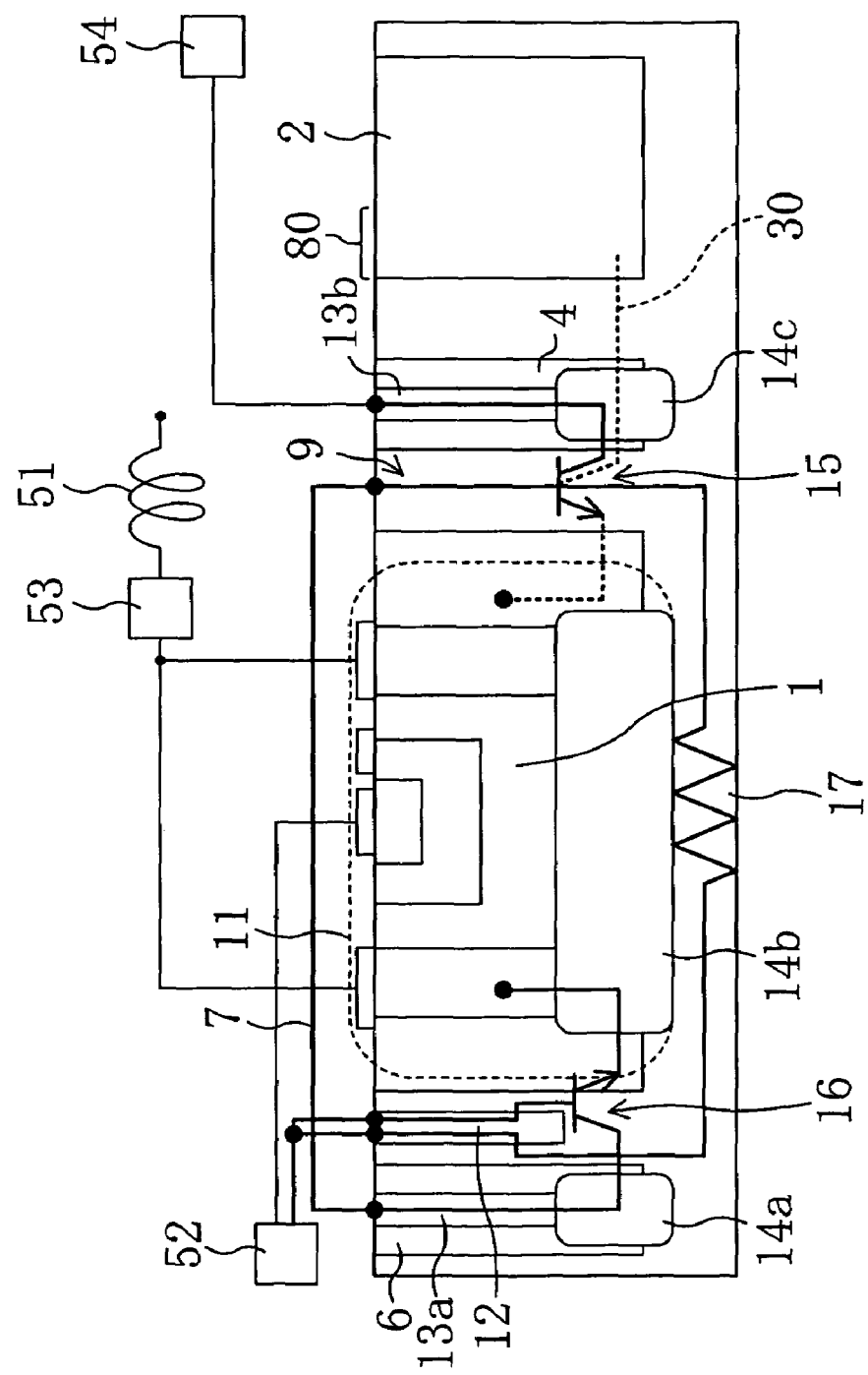
FIG. 3 is a schematic section for explaining parasitic transistors in the semiconductor device shown in FIG. 1.

FIG. 1 is a view schematically showing in section a structure of the essential part of a semiconductor device according to Embodiment 1, FIG. 2 is a schematic plan view of the semiconductor device of the present embodiment, and FIG. 3 is a schematic section for explaining parasitic transistors. FIG. 1 and FIG. 3 are sections, wherein no hatching is drawn for the sake of easy description. The same is applied to FIG. 4 and FIG. 5 referred to later.

In the semiconductor device of the present embodiment, there are formed, in a semiconductor substrate 3 to which a P-type impurity is doped, an island (hereinafter referred to as a power transistor region) 1 that composes a power transistor (an output circuit), an island (hereinafter referred to as a control circuit region) 2 that composes a control circuit, a first dummy region 4, and a second dummy region 6. In the control circuit region 2, various elements such as a transistor, a resistor, a capacitor element, and the like are formed, and accordingly, the region 2 as a whole may serve as a control circuit. The power transistor region 1 is formed of an epitaxial layer in which a low-concentration N-type impurity is introduced while the control circuit region 2 is formed of a semiconductor layer in which an N-type impurity is introduced. The first dummy region 4 is formed of a semiconductor layer in which an N-type impurity is introduced and the second dummy region 6 is formed of a semiconductor layer in which an N-type impurity is introduced, also. Further, buried layers 14a, 14b, 14c in which a high-concentration N-type impurity is introduced are provided at the bottoms of the second dummy region 6, the power transistor region 1, and the first dummy region 4.

The power transistor of the present embodiment includes a pair of a ground side transistor and a power side transistor which compose a push-pull circuit, wherein a transistor 11 (a part enclosed by the broken line) shown in FIG. 1 is the ground side transistor of the paired transistor. The first and second dummy regions 4, 6 are formed with the power transistor region 1 in which the ground side transistor 11 is formed interposed.

Because the power transistor 11 is required to have a function to make a large amount of drive current to flow, the power transistor region 1 must occupy the surface of the semiconductor substrate 3 largely. The epitaxial layer of the power transistor region 1 corresponds to a collector of the power transistor 11 and is connected to an output bonding pad 53 generally formed within this region. In the present embodiment, a high-concentration N-type conductor paths 20 are provided for reducing the resistance of current paths to the collector electrodes.

The first dummy region 4, which serves to prevent malfunction of the control circuit, is formed between the control circuit region 2 and the power transistor region 1 in which the ground side transistor 11 is formed and is connected to a power source bonding pad 54. Multiple small squares indicated by the broken lines in FIG. 2 indicate contact windows for metal wirings to parts of the dummy regions 4, 6 or the semiconductor substrate 3.

The power transistor 11 shown in FIG. 1 is a vertical NPN bipolar transistor including a P-type base diffusion layer 18 formed in the power transistor region 1, an N-type emitter diffusion layer 19 formed in the base diffusion layer 18, and the N-type power transistor region 1 as a collector. The power transistor 11 performs transistor operation in the vertical direction immediately below the emitter diffusion layer 19. The N-type buried layer 14b and the N-type conductor paths 20 are provided for reducing the resistance of the current paths to the collector electrodes. The emitter diffusion layer 19 is connected to a grounding bonding pad 52, the N-type conductor paths 20 and the power transistor region 1 are connected to an output bonding pad 53 through the collector electrodes, and the base diffusion layer 18 is connected to the output side (not shown) of the control circuit. The output bonding pad 53 is connected to an inductive load 51 such as a coil or the like provided outside the semiconductor device. The power transistor 11 under control by the control circuit switches to drive the inductive load 51.

The N-type buried layer 14a and a N-type diffusion layer 13a in the second dummy layer 6 and the N-type buried layer 14c and a N-type diffusion layer 13b in the first dummy region 4 are provided for reducing the resistance components in the dummy regions 4, 6, respectively.

In the present embodiment, the second dummy region 6 is arranged between the chip end part 5 of the semiconductor substrate 3 and the power transistor region 1 and is connected to a part 9 of the semiconductor substrate 3 which is located between the power transistor region 1 and the first dummy region 4 by means of a metal wiring 7. A P-type diffusion layer 12 is formed in the semiconductor substrate 3 between the second dummy region 6 and the power transistor region 1 and is connected to the grounding bonding pad 52 by means of a metal wiring 8. A part of the semiconductor substrate 3 in the vicinity of the first dummy region 4 is not grounded.

Next, operation of the semiconductor device of the present embodiment will be described with reference to FIG. 3 in which parasitic transistors are indicated.

In the above structure, two parasitic transistors may be present which use the power transistor region 1 for the power transistor as an emitter. One of them is a first parasitic transistor 15 that uses the power transistor region 1 as an emitter, the semiconductor substrate 3 as a base, and the first dummy region 4 as a collector. The other one is a second parasitic transistor 16 that uses the power transistor region 1 as an emitter, the semiconductor substrate 3 as a base, and the second dummy region 6 as a collector.

When the current to the inductive load 51 is halted, the potential of the output bonding pad 53 becomes lower than the ground potential (substrate potential), namely, becomes negative because of the characteristic of the inductive load 51 to provide forward voltage between the bases and the emitters of the first parasitic transistor 15 and the second parasitic transistor 16. With this forward voltage, the first parasitic transistor 15 and the second parasitic transistor 16 are apt to turn ON.

When the second parasitic transistor 16 turns ON, the base current thereof is supplied from the P-type diffusion layer 12 to which the grounding bonding pad 52 is connected. The collector current of the second parasitic transistor 16 attempts to flow from the second dummy region 6. However, due to lack of current supplying ability in the second dummy region 6, the collector current shall be supplied through a part connected to the second dummy region 6, namely, supplied through a current path from the grounding bonding pad 52 to the P-type diffusion layer 12, the semiconductor substrate 3 (a substrate resistor 17), the metal wiring 7, and then, to the second dummy region 6 (the N-type diffusion layer 13a). The semiconductor substrate 3 inherently has a parasitic resistance component, which is referred to as the substrate resistor 17 herein. The flow of the collector current of the second parasitic transistor 16 through the substrate resistor 17 causes voltage drop to lower the potential (substrate potential) of the part 9 of the semiconductor substrate 3 in the vicinity of the first dummy region 4 to negative. Accordingly, the base-emitter voltage of the first parasitic transistor 15 becomes smaller than the base-emitter voltage of the second parasitic transistor 16, so that the first parasitic transistor 15 is hard to turn ON.

If there is no second parasitic transistor like the conventional one, the collector current 30 flows between the control circuit region 2 and the first parasitic transistor 15 when the first parasitic transistor 15 turns ON to cause malfunction of the control circuit, involving a significant problem. In contrast, in the present embodiment, when the second parasitic transistor 16 turns ON, the base potential (substrate potential) of the first parasitic transistor 15 lowers, so that the first parasitic transistor 15 is hard to turn ON. As a result, malfunctions of the control circuit region 2 and the power transistor 11 operated in accordance with an output signal thereof are hard to occur, involving no problem.

In order to make the most of the effects of the semiconductor device which suppress the operation of the first parasitic transistor 15 in accordance with the aforementioned operation principal, it is preferable to set the substrate resistance of a part of the high-concentration semiconductor substrate 3 between the second dummy region 6 and the power transistor region 1 of the ground side transistor 11 to be small as far as possible by forming the diffusion layer 12 of the same conductive type (P-type) as that of the semiconductor substrate 3 in the part. This reduces impedance in the base of the second parasitic transistor 16 that uses the second dummy region 6 as a collector, thereby promoting the second parasitic transistor 16 to turn ON.

On the other hand, it is preferable to set the substrate resistance of the part 9 of the semiconductor substrate 3 between the first dummy region 4 and the power transistor region 1 of the ground side transistor 11 comparatively high rather than low by not forming a diffusion layer in the part 9. Further, it is preferable not to connect the grounding bonding pad 52 to a part in the vicinity of the part 9 of the semiconductor substrate 3, namely, is preferable not to ground it. Because, when the collector current of the second parasitic transistor 16 flows in the semiconductor substrate 3, voltage drop is caused due to the presence of the substrate resistor 17 in the semiconductor substrate 3 to lower the potential (substrate potential) of the part 9 of the semiconductor substrate 3 in the vicinity of the first dummy region 4 to negative. Accordingly, the base-emitter voltage of the first parasitic transistor 15 becomes smaller than the base-emitter voltage of the second parasitic transistor 16, allowing the first parasitic transistor 15 to be hard to turn ON.

In the present embodiment, voltage drop becomes severe, which is calculated by multiplying the substrate resistance and the collector current of the second parasitic transistor 16 that uses the second dummy region 6 as a collector. As a result, the substrate potential of the part 9 of the semiconductor substrate 3 in the vicinity of the first dummy region 4 can be rather negative, further reducing the collector current (parasitic current) of the first parasitic transistor 15 that uses the first dummy region 4 as a collector. The semiconductor device according to the present embodiment can be manufactured by any known semiconductor manufacturing method in which photolithography process, impurity introduction, thermal treatment, thermal oxidation, and the like are combined.

The effect of reduction in parasitic current in the present embodiment will be verified quantitatively.

If a power transistor of which output current is about 1 A is integrated in a semiconductor device by a general manufacturing process, the substrate resistance of the semiconductor substrate 3 immediately below the power transistor is about 10 Ω. Suppose that a resistance R17 of the substrate resistor 17 is 10 Ω and a collector current Ic16 of the parasitic transistor 16 when the output current is 1 A is 20 mA. Voltage drop by the substrate resistor 17 is obtained by multiplying the resistance R17 and the collector current Ic16. Under the above supposition, the substrate potential (base potential of the first parasitic transistor 15) between the power transistor region 1 and the first dummy region 4 is −200 mV with respect to the ground potential of the grounding bonding pad 52. Specifically, the base-emitter voltage Vbe of the first parasitic transistor 15 becomes 200 mV lower than the voltage when the base of the first parasitic transistor 15 is grounded.

Further, it is known that a collector current of a transistor varies depending on an exponential function of the magnitude of a base-emitter voltage Vbe thereof and can be expressed by the following expression (1).

$$Ic = Is \, \exp(Vbe \cdot q/kT) \tag{1}$$

Wherein, Is is a saturation current of a transistor, q is a charge amount of electrons, k is a Boltzmann constant, T is an absolute temperature, and q/kT at room temperature is about 26 mV.

When the collector current when the base-emitter voltage Vbe is Vbe1 is Ic1 and the collector current when the base-emitter voltage Vbe is Vbe2 that is lower than Vbe1 is Ic2, the current ratio Ic2/Ic1 can be obtained by the following expression (2) based on the above expression (1).

$$Ic2/Ic1 = \exp((Vbe2 - Vbe1)q/kT) \tag{2}$$

q/kT in the above expression (1) is about 26 mV at room temperature. When it is assigned to the expression (2), the collector current Ic of the first parasitic transistor 15 is about 1/2000 reduced due to 200 mV lowering of the base-emitter voltage Vbe.

When the base of the first parasitic transistor 15 is grounded, the potential of the power transistor region 1 contributes directly to the base-emitter voltage of the first parasitic transistor 15 when the potential of the power transistor region 1 becomes negative. Accordingly, the collector current Ic1 of the first parasitic transistor 15 becomes 20 mA. However, in the present invention, the second parasitic transistor 16 is made conductive to lower the substrate potential in the control circuit region 2 that corresponds to the base of the first parasitic transistor 15, thereby attaining reduction in the collector current Ic2 of the first parasitic transistor 15 to 10 μA. This means reduction by three orders of magnitude. In comparison with the conventional technique disclosed in the aforementioned document, also, the collector current of the first parasitic transistor 15 is reduced by two orders of magnitude.

As described above, the absolute amount of the collector current of the first parasitic transistor 15 can be reduced by orders of magnitude, so that the first parasitic transistor 15 less influences the control circuit to increase the reliability of the circuit operation of the drive circuit integrated in the semiconductor device. In short, little or no malfunction of the control circuit is caused. Further, the present embodiment eliminates the need to connect the first dummy region 4 to the power source bonding pad 54, unlike the aforementioned conventional techniques, and accordingly, the first dummy region 4 may be connected to the grounding bonding pad 52. This eliminates the need to supply the circuit current for parasite preventing operation from an external power source, attaining reduction in consumption current (source current) of the semiconductor device, compared with the conventional technique. The effect of reduction in the consumption current is more effective as a switching frequency is higher and the effect becomes remarkable at switching frequencies of 100 KHz or larger.

It is noted that the best mode in which both the first dummy region 4 and the second dummy region 6 are provided is explained in the present embodiment but it is possible that only the second dummy region 6 for control is provided adjacent to the power transistor region 1 without the first dummy region 4 formed (this case is referred to as Embodiment 1B). In this case, the control circuit region 2 serves as a collector of the first parasitic transistor 15. The collector current is very small, and therefore, a remarkable effect of reduction in parasitic current can be obtained compared with the aforementioned conventional technique though the effect is inferior to that in the case where both the first dummy region 4 and the second dummy region 6 are provided.

In addition, when only a resistance element and/or a capacitor element is/are arranged in a region 80 of the control circuit 2 adjacent to a power transistor group and the potential of the region 80 is set to be equal to the source potential or the ground potential, no parasitic transistor is formed in the region 80 of the control circuit 2 adjacent to the power transistor group. The arrangement in which only the resistance element and/or the capacitor element is/are arranged so as to receive no influence of the parasitic transistor is equivalent to formation of a path for a parasitic current flowing in a parasitic transistor. Hence, malfunction of the control circuit is further restrained without the parasitic current flowing in the transistors in the control circuit. It is noted that the resistance element and the capacitor element which are formed in the region 80 adjacent to the power transistor group in the control circuit are preferably dummy elements that do not contribute to the operation of the control circuit.

(Embodiment 2)

Embodiment 2 of the present invention will be described below with reference the drawings.

Embodiment 2 refers to an output circuit to which a power MOS transistor is push-pull connected.

Figure 4:
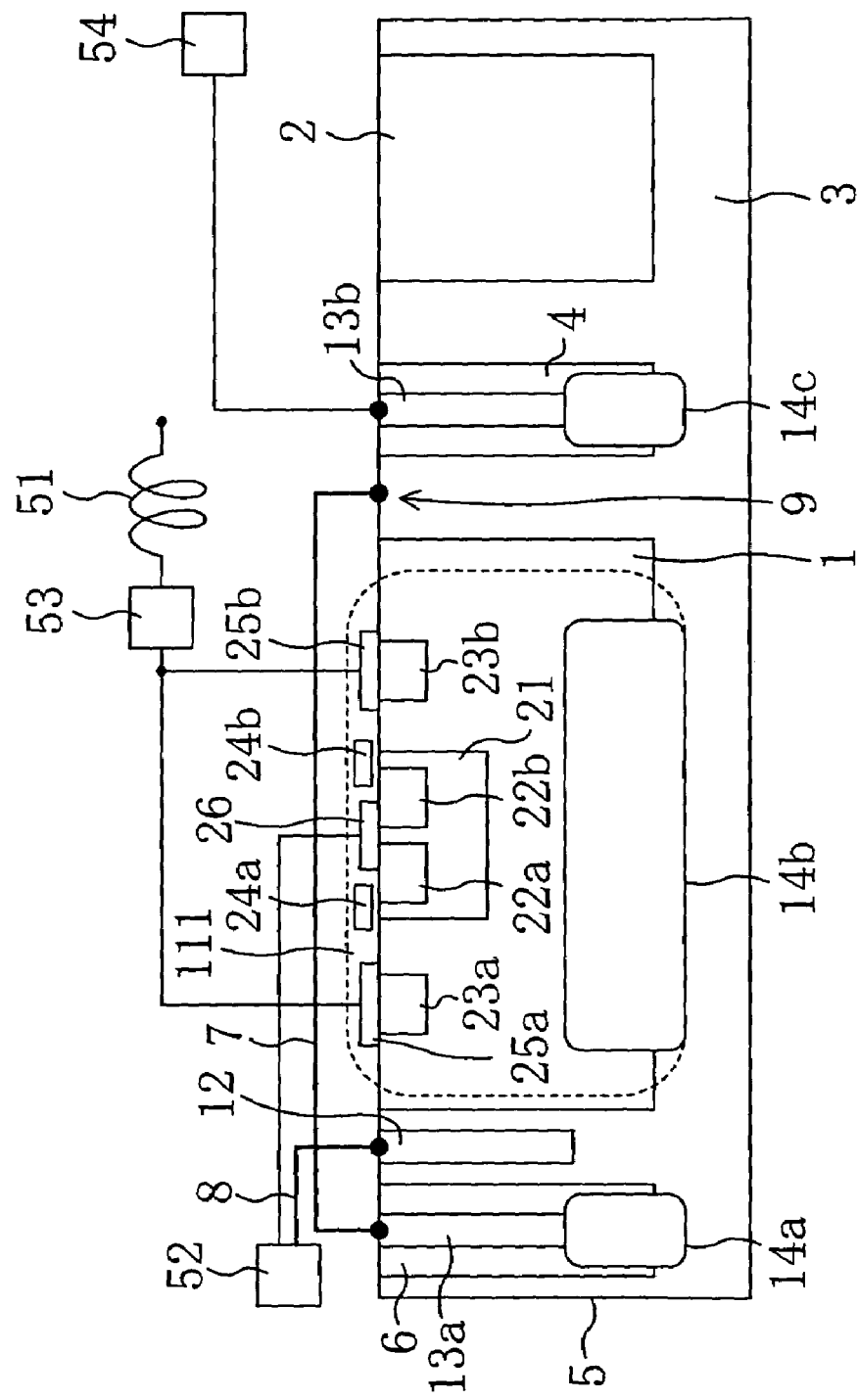
FIG. 4 is a schematic section of a semiconductor device according to Embodiment 2.

As shown in FIG. 4, an N-type second dummy region 6 is arranged between a chip end part 5 and a ground side DMOS transistor 111. Wherein, the present embodiment is different from Embodiment 1 in structure of a power transistor and is the same in the other part thereof as that in Embodiment 1. Therefore, the structure of the power transistor, that is, the ground side DMOS transistor 111 will be described first.

In the power transistor 111, a P-type body diffusion layer 21 is formed in a part of the surface portion of a power transistor region 1 and N-type source diffusion layers 22a, 22b are formed in the surface portion of the body diffusion layer 21. A source electrode 26 is provided on the surface of the power transistor region 11 so as to straddle the two source diffusion layers 22a, 22b. N-type drain contact diffusion layers 23a, 23b are formed in the surface portion of the power transistor region 1 apart from the body diffusion layer 21, a gate insulating film (not shown) and gate electrodes 24a, 24b respectively extending from the source diffusion layers 22a, 22b to the drain contact diffusion layers 23a, 23b are formed on the surface of the power transistor region 1, and an N-type buried layer 14b is formed in the lower part of the power transistor region 1.

The power transistor region 1 of the power transistor 111 functions as a drain of the power transistor 111, and is connected to a inductive load 51 through drain electrodes 25a, 25b respectively provided on the drain contact diffusion layers 23a, 23b and through the output bonding pad 53.

Figure 5:
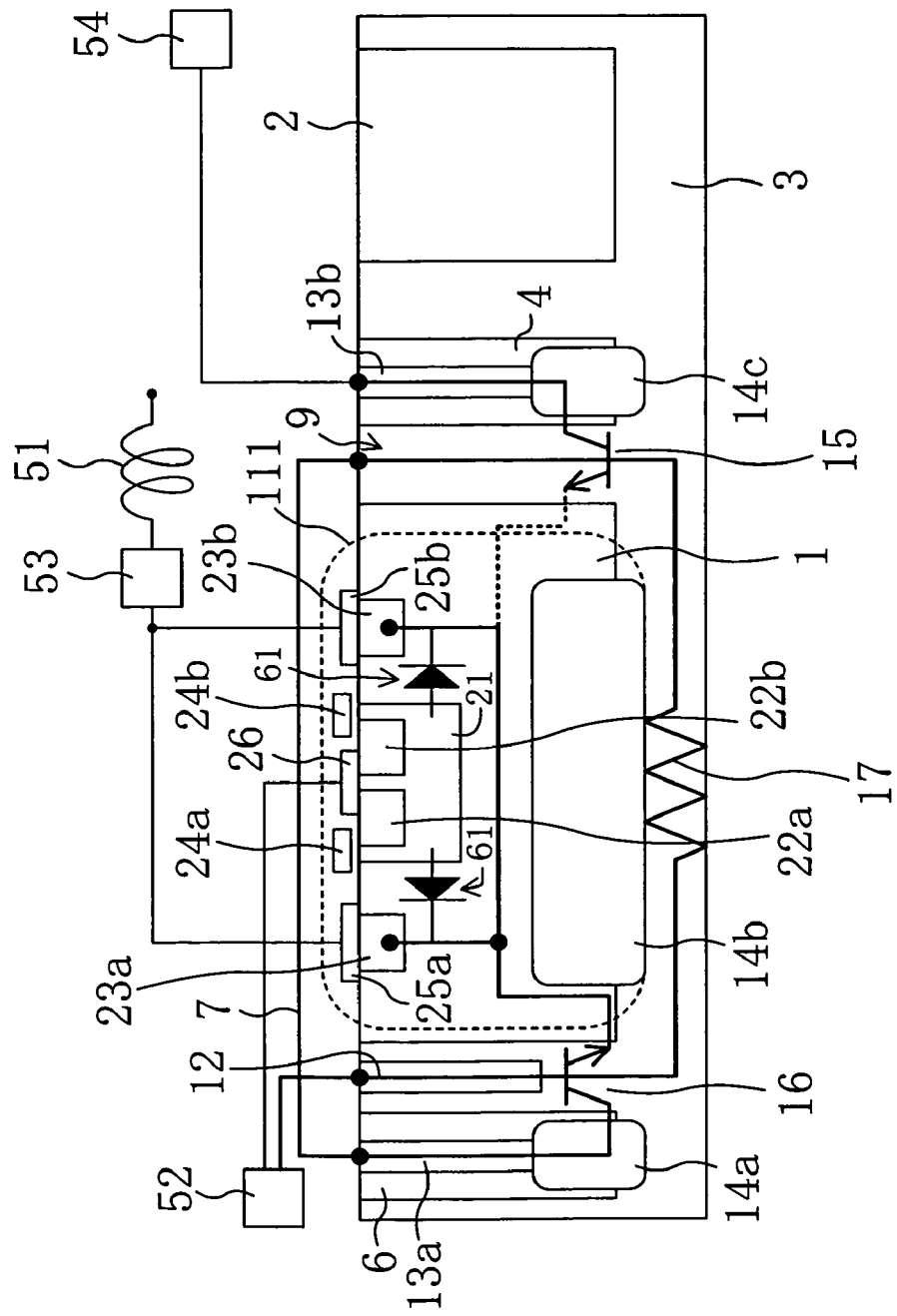
FIG. 5 is a schematic section for explaining parasitic transistors in the semiconductor device according to Embodiment 2.

FIG. 5 shows parasitic elements. Operation of the semiconductor device according to the present embodiment will be described with reference to FIG. 5. Wherein, the structures of the first and second parasitic transistors 15, 16 are the same as those in Embodiment 1 substantially.

When the current supply to the inductive load 51 is halted, the potential of the output bonding pad 53 becomes lower than the ground potential because of the characteristic of the inductive load 51. The anodes of body diodes (parasitic diodes) 61 are connected to the grounding bonding pad 52 through the source electrode 26 while the cathodes thereof are connected to the output bonding pad 53 through the drain electrodes 25a, 25b, respectively. Accordingly, when the potential of the output bonding pad 53 becomes lower than the ground potential, the body diodes 61 turn ON, so that the potential of the output bonding pad 53 is clamped at the ground-diode voltage.

The base of the second parasitic transistor 16 is also grounded, so that the base-emitter voltage is generated to turn on the second parasitic transistor 16. The turning ON of the second parasitic transistor 16 allows to the collector current thereof to pass through the metal wiring 7 and the substrate resistor 17 of the semiconductor substrate 3, and then, to be supplied from the grounding bonding pad 52. This makes the potential of the power transistor region 1 to have negative potential. Further, because the second parasitic transistor 16, which uses the second dummy region 6 as a collector, is conductive, the potential of the part 9 of the semiconductor substrate 3 between the power transistor region 1 and the first dummy region 4 becomes negative due to voltage drop of which voltage corresponds to a product of the collector current of the second parasitic transistor 16 and the substrate resistance of the substrate resistor 17. This makes the first parasitic transistor 15 to be hard to become conductive, reducing the parasitic collector current of the first parasitic transistor 15 by the orders of magnitude, and causing little or no malfunction of the control circuit that controls the power transistor 111. Examples of actual numeric values in the effects are the same as those in Embodiment 1 and the description thereof is omitted. Also, the present embodiment exhibits an effect of reduction in consumption current equivalent to that in Embodiment 1.

It is noted that the DMOS power transistor is referred to in the present embodiment but the present embodiment can attain the same effects and can be reduced in practice by using a bipolar or CMOS power transistor. In addition, it is preferable to provide a resistance element or a capacitor element in a region of the control circuit where it is adjacent to the power transistor group.

(Embodiment 3)

Embodiment 3 relates to an arrangement in plan of various elements and dummy regions in a semiconductor substrate. Prior to the description of the present embodiment, a drive circuit for a general three-phase motor and a comparative example will be described.

Figure 8:
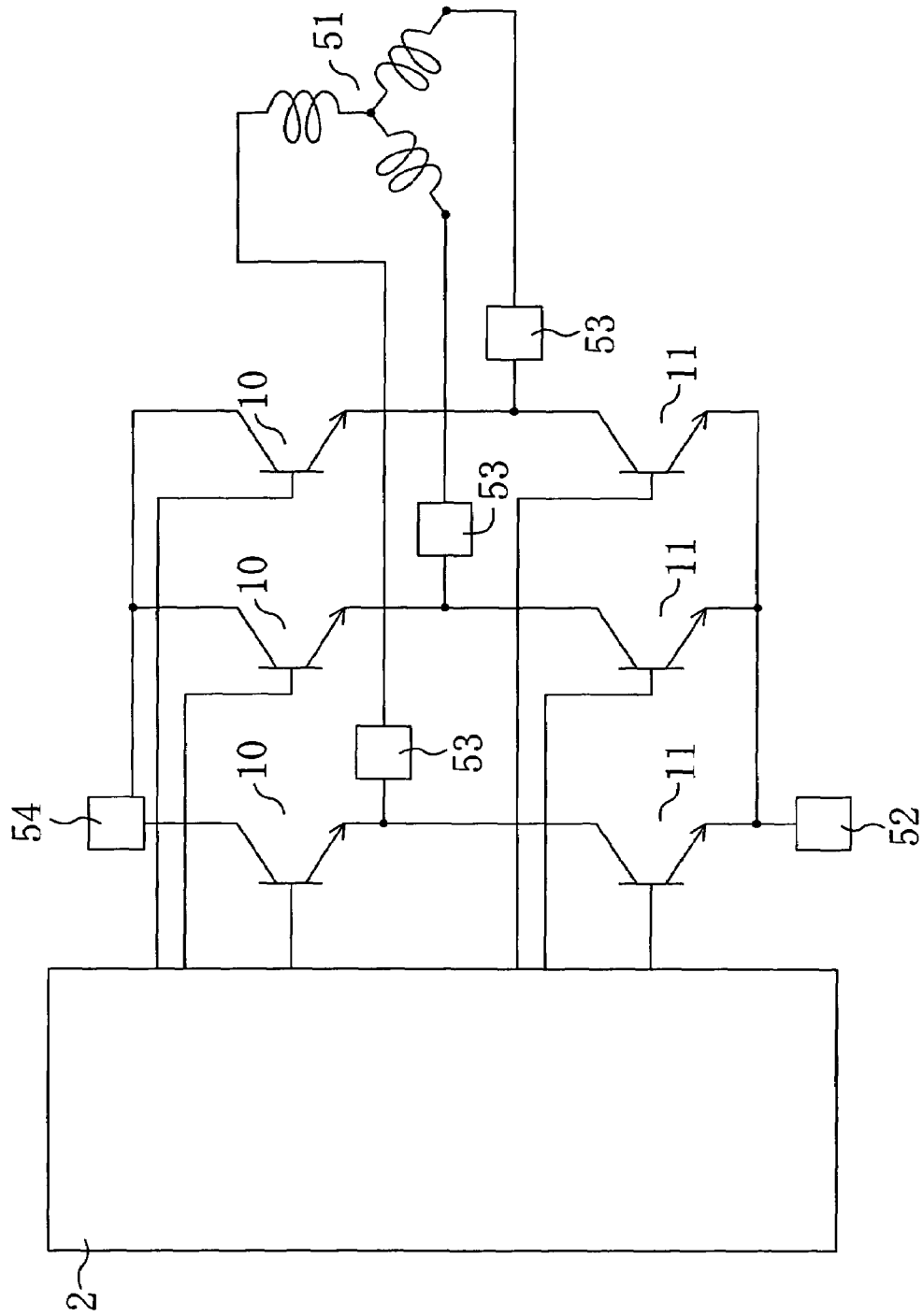
FIG. 8 is a circuit diagram of a drive circuit for a general three-phase motor.
Figure 9:
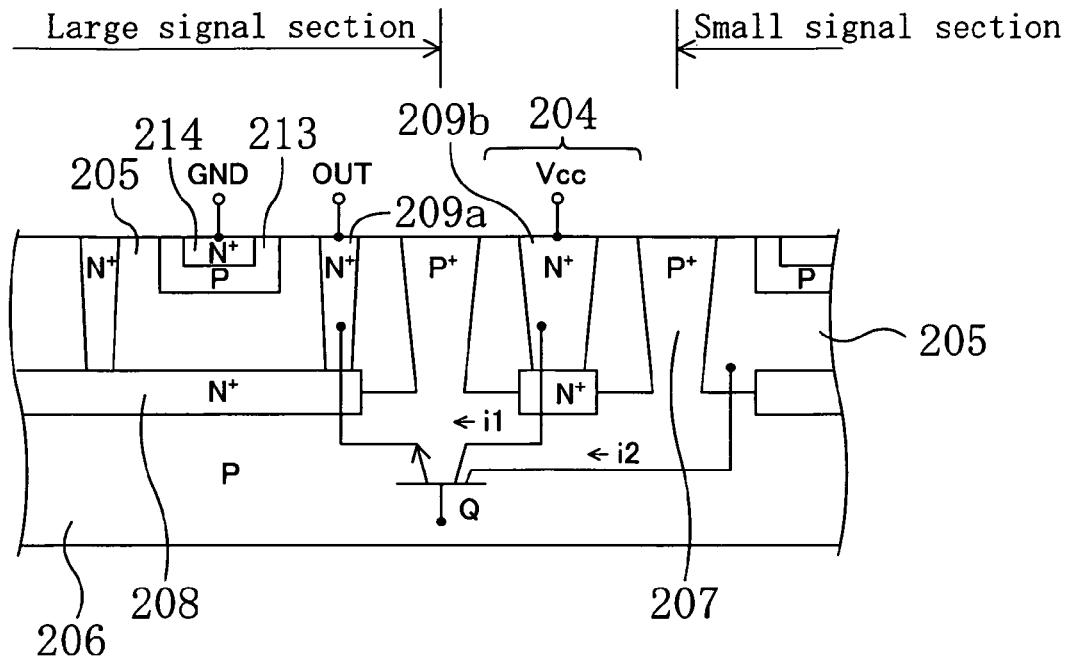
FIG. 9 is a section of a conventional semiconductor device.
Figure 10:
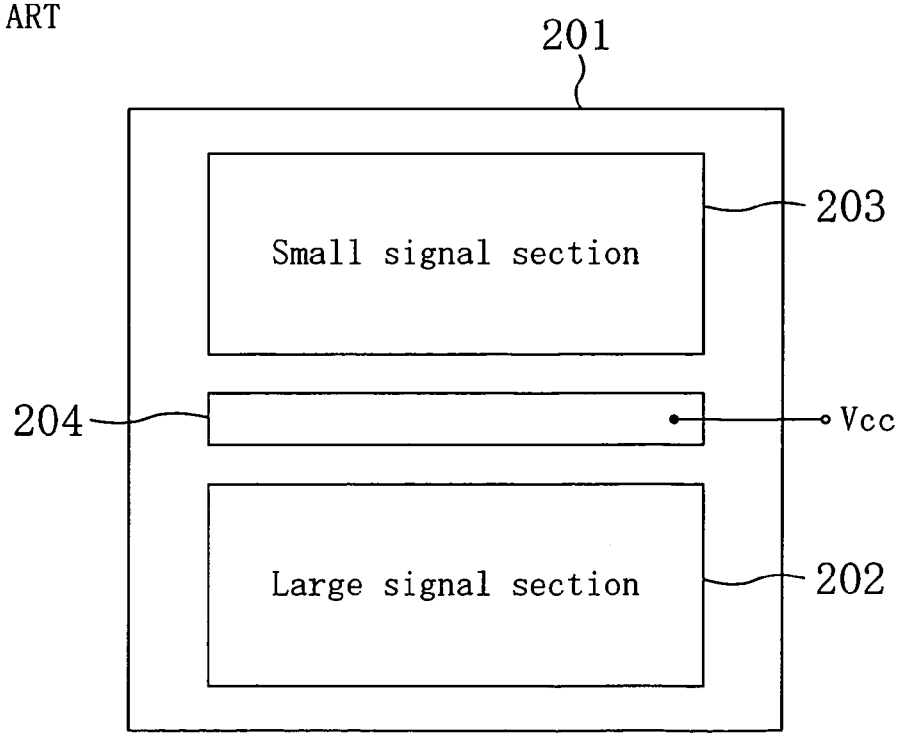
FIG. 10 is a plan view of the conventional semiconductor device.

FIG. 8 indicates the drive circuit for a general three-phase motor. Each of three pairs of power source side power transistors 10, 10, 10 and ground side power transistors 11, 11, 11 is connected between a source terminal 54 and a grounding terminal 52 in series. Also, the pairs of the power source side power transistors 10, 10, 10 and the ground side power transistors 11, 11, 11 are connected correspondingly to the phases of the three-phase motor coil (inductive load) 51. Output terminals 53, 53, 53 are connected between the emitters of the power source side power transistors 10, 10, 10 and the collectors of the ground side power transistors 11, 11, 11, respectively, and are connected correspondingly to the phases of the motor coil 51. Each of the power transistors 10, 10, 10 and 11, 11, 11 is connected to the control circuit 2 to drive the motor coil 51 in response to a control signal from the control circuit 2. Wherein, the control circuit 2 serves as the entirety of the control circuit region in the present embodiment.

The above motor drive circuit is integrated as a whole and the power transistors built in an IC (semiconductor device) require a comparatively large area for allowing a large amount of current to flow. Therefore, the power transistors occupy large in the semiconductor chip. Problems may rise depending on arrangement of the power transistors.

For example, in the case where a power transistor of which current capacity is 1 A is arranged, when a current of 1 A flows in a wiring for the arrangement, considerably large (1 V) voltage drop is caused even if the resistance of the wiring is small, for example, 1 Ω. Such voltage drop degrades the electric characteristics of a drive circuit integrated in a semiconductor device and especially lowers the current power. Therefore, in order to ensure the current power of a control circuit integrated in a semiconductor device, the wiring resistance of metal wirings for power transistors must be low as far as possible and is preferably 0.1 Ω or lower. In turn, it is necessary to increase the wiring width and reduce the wiring length of the metal wirings. Further, it is necessary to arrange the grounding bonding pad 52 and the power source bonding pad 54 of the push-pull output circuit immediately beside the power transistors and to arrange the output bonding pad 53 between the power source side power transistor 10 and the ground side power transistor 11. This arrangement reduces the resistance of the metal wirings.

Figure 11:
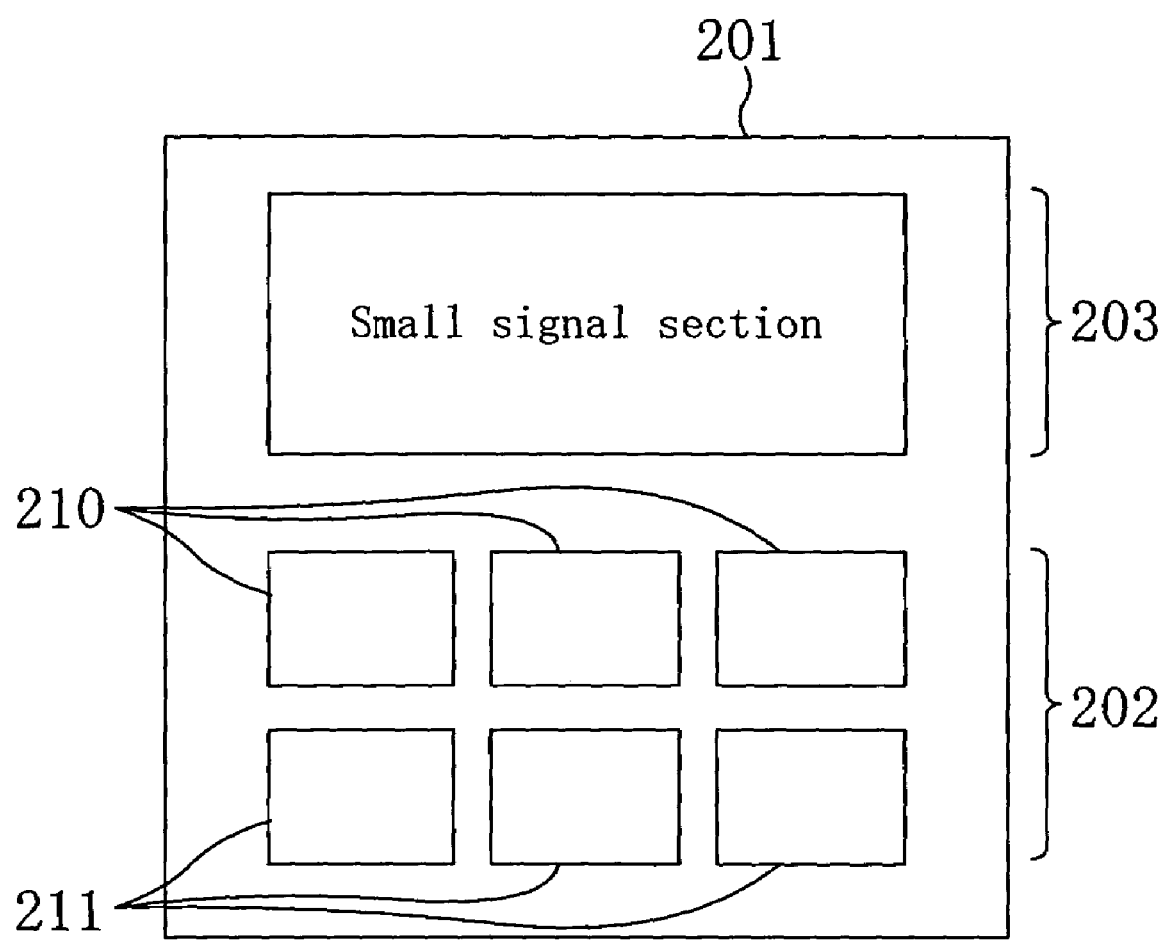
FIG. 11 is a plan view of another conventional semiconductor device.

Meanwhile, the aforementioned document further discloses a method of controlling a parasitic current by devising arrangement of the power transistor 202, as shown in FIG. 11. Specifically, the power source side power transistor 210 that operates no parasitic transistor is arranged between the control circuit 203 and the ground side power transistor 211 in the semiconductor chip 201, thereby minimizing the current amplification of the parasitic transistor.

Figure 7:
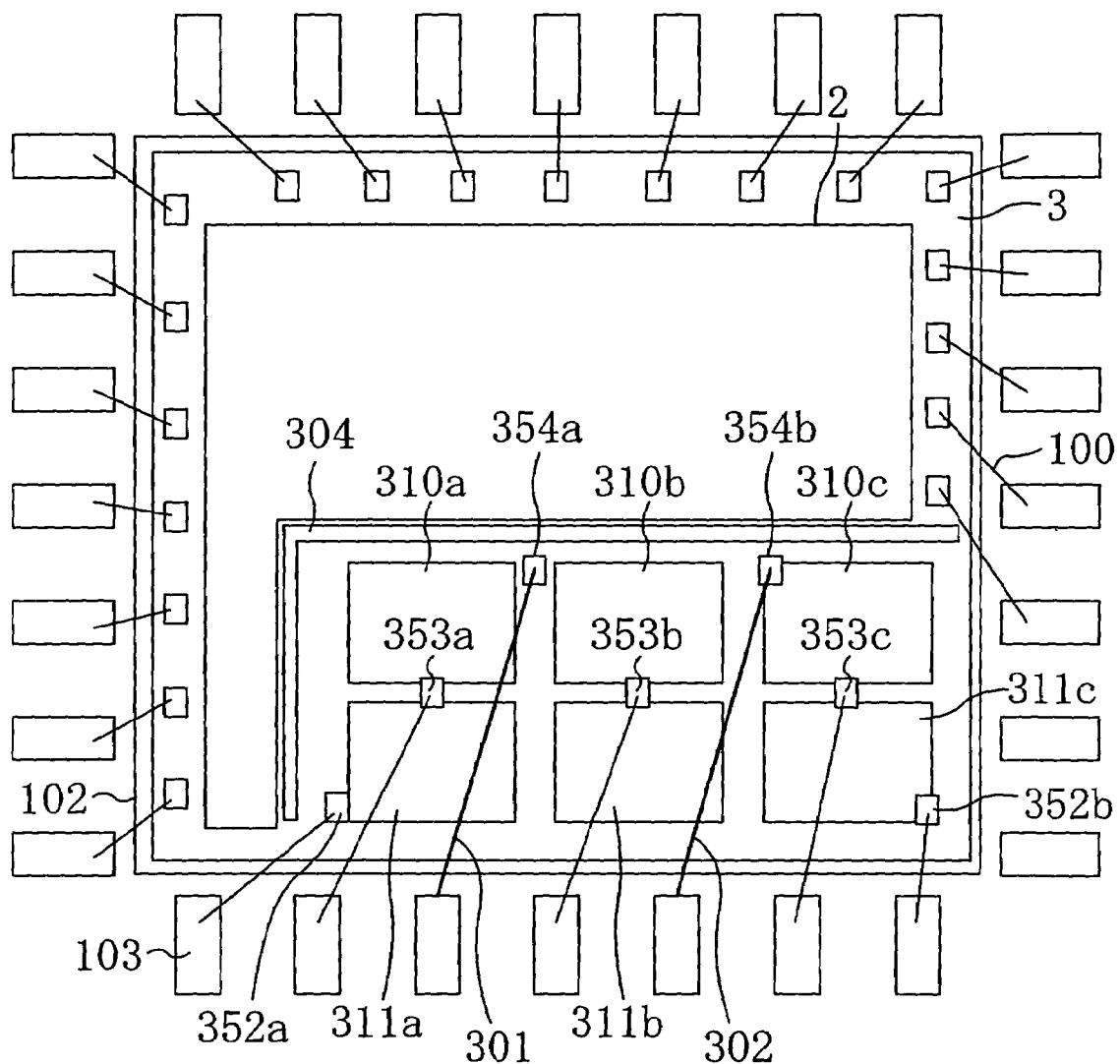
FIG. 7 is a plan view showing the positional relationship between power transistors and bonding wires according to a comparative example.

However, in the case where the power transistor arranging method in the document is employed, elements, pads, and wirings may be arranged as schematically shown in FIG. 7. The arrangement shown in FIG. 7 is called the comparative example. In the comparative example, three pairs of power source side power transistors 310a, 310b, 310c and ground side power transistors 311a, 311b, 311c are arranged in a group along one side of a semiconductor substrate 3, wherein the one side corresponds to the lower side thereof in FIG. 7. A control circuit 2 is arranged dominantly in the upper part of the semiconductor substrate (a semiconductor chip) 3 and has a narrow strip portion extending along the left side of the semiconductor substrate 3. Namely, the control circuit 2 is formed in an L-shape on the semiconductor substrate 3. An L-shaped dummy region 304 is formed between the control circuit 2 and the power transistor group. Of the grouped power transistors, the power source side power transistors 310a, 310b, 310c are arranged between a part of the control circuit 2 which occupies the upper part thereof and the ground side power transistors 311a, 311b, 311c, respectively. This arrangement can set the respective distances between the ground side power transistors 311a, 311b, 311c and the control circuit 2 long with the respective power source side transistors 310a, 310b, 310c interposed, minimizing the current amplification (hFE) of the parasitic transistor.

Bonding pads for the control circuit 2 are provided at the chip end part along the left side, the upper side, and the right side of the semiconductor substrate 3. Output bonding pads 353a, 353b, 353c are provided between the ground side power transistors 311a, 311b, 311c and the power source side power transistors 310a, 310b, 310c, respectively. A power source bonding pad 354a for the power source side power transistors 310a and 310b is arranged between the power source side transistors 310a, 310b and is connected to the power source side transistors 310a, 310b on the semiconductor substrate 3 by means of short metal wirings so that the resistance of the metal wirings does not become high. A power source bonding pad 354b for the remaining power source side power transistor 310c is arranged immediately beside the power source side power transistor 310c for connecting only the power source side power transistor 310c. Further, setting bonding pads 352a, 352b respectively connected to the ground side power transistors 311a, 311c are formed in the vicinity of the ground side power transistors 311a, 311c, respectively. The above power transistor arrangement contemplates reduction in parasitic current and increase in current power of the control circuit 2.

The semiconductor chip 3 is mounted on a die pad 102 of a lead frame, lead pins arranged around the die pad 102 are connected to the bonding pads on the semiconductor chip 3 by means of bonding wires 100, 301, 302, and then, resin sealing is performed, thereby completing a semiconductor device.

In the above transistor arrangement, however, the power source side power transistors 310a, 310b, 310c are arranged in the middle of the semiconductor chip 3, resulting in longer length of the bonding wires 301, 302 for respectively connecting the power source bonding pads 354a, 354b than that of the bonding wire 100. This causes downward sag of the middle part of the longer bonding wires 301, 302, inviting danger of contact with a chip end part of the semiconductor chip 3. A semiconductor layer is exposed at the chip end part of the semiconductor chip 3. If the semiconductor layer is in contact with the bonding wire 301 or 302, the semiconductor device becomes a defective. In turn, the yield of the assembling process (generally called a post process) of the semiconductor device might be lowered in the comparative example.

For tackling this problem, the distances between the surface of the semiconductor chip 3 and the middle parts of the bonding wires 301, 302, may be set large, namely, the level of the wirings may be set high. However, this disables accommodation within a thin package for surface mounting.

Figure 6:
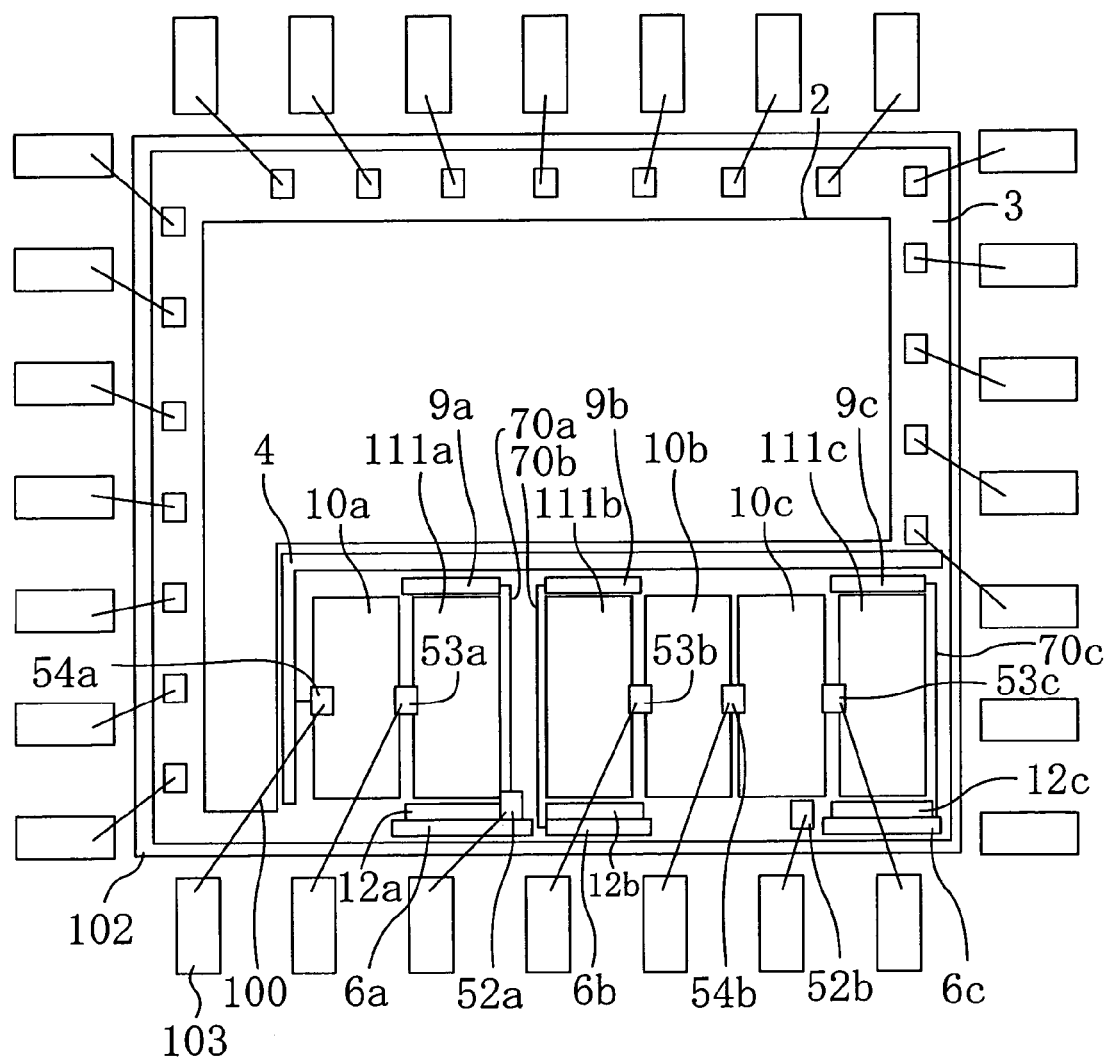
FIG. 6 is a schematic plan view of a semiconductor device according to Embodiment 3.

In order to solve the above problems, the present inventor has examined element arrangement in plan on a semiconductor substrate to reach the present invention. As one example of the present invention, the semiconductor device according to Embodiment 3 of the present invention will be described with reference to FIG. 6 showing a state where the semiconductor device is mounted on a lead frame.

In the semiconductor device of the present embodiment, a power transistor group (an output circuit) of the power source side power transistor 10a, 10b, 10c and the ground side power transistors 111a, 111b, 111c are arranged separately from the control circuit 2, and the first dummy region 4 is formed therebetween. The control circuit 2 is formed in a L-shape on the semiconductor substrate 3 so as to hold the power transistor group by L-shape forming two sides thereof. One side of the two sides which forms a narrow strip portion of the control circuit 2 adjacent to the power transistor group is adjacent to the power source side power transistor 10a while the power transistors of the power transistor group are arranged in a row along the other side thereof. The grounding bonding pads 52a, 52b are arranged near the chip end part of the semiconductor substrate 3 in the vicinity of the ground side power transistors 111a, 111b, 111c. In the vicinity thereof, the second dummy regions 6a, 6b, 6c are arranged between the ground side power transistors 111a, 111b, 111c and the chip end part of the semiconductor substrate 3, respectively. A part 12a of the semiconductor substrate 3 between the ground side power transistor 111a and the second dummy region 6a is connected to the grounding bonding pad 52a, a part 12b of the semiconductor substrate 3 between the ground side power transistor 111b and the second dummy region 6b is connected to the grounding bonding pad 52a, and a part 12c of the semiconductor substrate 3 between the ground side power transistor 111c and the second dummy region 6c is connected to the grounding bonding pad 52b. Further, the second dummy regions 6a, 6b, 6c are connected, by means of wirings 70a, 70b, 70c formed on the semiconductor substrate 3, to parts 9a, 9b, 9c of the semiconductor substrate 3 which face the second dummy regions 6a, 6b, 6c, respectively, with the ground side power transistors 111a, 111b, 111c interposed.

When the ground side power transistors 111*a*, 111*b*, 111*c* are arranged in this way, the effect of reduction in parasitic current becomes greater by orders of magnitude than the conventional technique, as described in Embodiment 2. Hence, a large amount of parasitic current can be reduced and malfunction of the control circuit 2 is prevented even unless the power source side power transistors 10*a*, 10*b*, 10*c* are arranged beside the control circuit 2 for reducing the current amplification (hFE) of the parasitic transistor 15. The comparative example constrains the power source side power transistors 310*a*, 310*b*, 310*c* to be adjacent to the control circuit 2 and the ground side power transistor 311*a*, 311*b*, 311*c* not to be adjacent to the control circuit 2. In contrast, such constraints are not imposed on the present invention and the six power transistors of the power source side power transistors 10*a*, 10*b*, 10*c* and the ground side power transistor 111*a*, 111*b*, 111*c* can be arranged in a row along one side of the semiconductor chip. Accordingly, the power source bonding pads 54*a*, 54*b* and the output bonding pads 53*a*, 53*b*, 53*c* can be arranged closely to the chip end part of the semiconductor substrate 3 and the bonding wires for connecting them to the lead frame can be reduced in length compared with that of the semiconductor device in the comparative example. Hence, assembly failure of the semiconductor device is hard to occur, thereby obtaining a secondary effect of good assembly yield of the semiconductor device.

When the power source bonding pads 54*a*, 54*b* and the output bonding pads 53*a*, 53*b*, 53*c* are arranged along the center line of the row of the power transistors in the above arrangement of the power transistors, the following additional and significant effects can be obtained.

When the power transistors are arranged as above, the bonding pads are connected to wirings for routing the element regions of the power transistors immediately beside the corresponding bonding pads. These wirings can be formed so as to have substantially the same length and the same width, making the currents flowing in the element regions of the power transistors to be equal to each other, thereby suppressing local heat generation within the element regions. As a result, an output current level that causes thermal breakdown of a transistor rises, raising a current level that causes breakdown of a semiconductor device to which this drive circuit is integrated. Thus, the reliability of the semiconductor device for drive can be enhanced.

It is noted that the present embodiment is the best mode in arrangement of bonding pads for a drive circuit but the bonding pads may be arranged slightly away from the center line of the row of the power transistors (a line connecting center points of the power transistors) to an extent that the use conditions of the semiconductor device permit. When the bonding pad row is arranged nearer to the chip end part than the center line, the bonding wirings 100 can be shortened and the output current power of the drive circuit is hard to be inhibited by the resistance components of the bonding wirings 100, thereby realizing a semiconductor device for drive having larger output current power.

Referring to a modification of the present embodiment, an arrangement is possible in which the layout of pairs of the power source side power transistors 10*a*, 10*b*, 10*c* and the ground side power transistor 111*a*, 111*b*, 111*c* are altered. Specifically, when the ground side power transistor 111*c* and the power source side power transistor 10*c* are arranged in this order from the right side to the left side in FIG. 6, a reverse pair of the power source side power transistor 10*b* and the ground side power transistor 111*b* is arranged next thereto, and then, the other pair, which is the reverse of the second one, of the ground side power transistor 111*c* and the power source side power transistor 10*c* is arranged next thereto.

With the above arrangement, the collectors can be arranged close to each other in the case where the two power source side power transistors 10*b* and 10*c* are bipolar transistors or the drains can be arranged close to each other in the case where the two power source side power transistors 10*b* and 10*c* are MOS transistors, shortening the metal wirings for connecting the collectors or the drains with the power source bonding pad 54*b* to a minimum. In this connection, the resistor components of the metal wirings become less to be ignorable. Thus, the wiring resistance of the metal wirings for the power source invites no reduction in output current of the drive circuit and the current power of the power transistors 10*b* and 10*c* can be exhibited sufficiently, thereby attaining a large output current.

Further, the metal wiring between the power source bonding pad 54*a* exclusively used for the power source side power transistor 10*a* and the collector (or the drain) of the power source side power transistor 10*a* can be shortened sufficiently. When the power transistors are arranged as above, the metal wirings of substantially the same length as the thus shortened metal wiring can be wired between the collector (or the drain) of the power source side power transistor 10*b* and the power source bonding pad 54*b* and between the collector (or the drain) of the power source side power transistor 10*c* and the power source bonding pad 54*b*. As a result, the output currents output from the three output circuits are balanced and become substantially the same with little or no influence of the wiring resistance of the metal wirings for the power source received. With the balanced outputs of the output currents of the three drive circuits, maximum power supply currents of the phases are balanced.

According to the present invention, when the region in which the ground side transistor is formed has negative potential by influence of the inductive load, a parasitic transistor using, as a collector, the second dummy region arranged in the vicinity of the ground side transistor turns ON, whereby the parasitic transistor that uses the second dummy region as a collector and is arrange in the vicinity of the control circuit becomes hard to turn ON to reduce the collector current of the parasitic transistor, thereby preventing malfunction of the control circuit. Further, both the ground side transistor and the power source side transistor are arranged at the end part of the semiconductor substrate, so that each length of the wires for connecting between the bonding pads on the semiconductor substrate and the lead pins can be shortened to thin the package of the semiconductor device.

What is claimed is:

1. A semiconductor device, comprising:
   a semiconductor substrate;
   an output circuit formed in the semiconductor substrate; and
   a control circuit formed in the semiconductor substrate for controlling the output circuit,
   the output circuit including at least one pair of a ground side transistor and a power source side transistor which compose a push-pull circuit,
   first and second dummy regions having a different conductive type from that of the semiconductor substrate being formed in the semiconductor substrate with the ground side transistor interposed,
   the first dummy region being located between the ground side transistor and the control circuit, and the second dummy region being connected electrically to a part of the semiconductor substrate between the ground side transistor and the first dummy region.

2. The semiconductor device of claim 1, wherein a part of the semiconductor substrate between the second dummy region and the ground side transistor is grounded.

3. The semiconductor device of claim 2, wherein the grounded part of the semiconductor substrate between the second dummy region and the ground side transistor has higher impurity concentration than the other part of the semiconductor substrate.

4. The semiconductor device of claim 2, wherein the part of the semiconductor substrate between the ground side transistor and the first dummy region is not grounded.

5. The semiconductor device of claim 4, wherein the output circuit is located between the control circuit and an end part of the semiconductor substrate, and the ground side transistor and the power source side transistor are arranged in a row along the end part of the semiconductor substrate.

6. The semiconductor device of claim 5, wherein the semiconductor substrate is in a rectangular shape, and the pair of the ground side transistor and the power source side transistor includes a plurality of pairs thereof, all of the ground side transistors and the power source side transistors being arranged in a row along one side of the semiconductor substrate.

7. The semiconductor device of claim 6, wherein the output circuit is formed substantially in a rectangular shape on the semiconductor substrate, the control circuit is formed in an L-shape and is arranged so as to be adjacent to two sides of the output circuit, and one of two sides of the control circuit adjacent to the output circuit is adjacent to the power source side transistor while the ground side transistor and the power source side transistor are arranged in a row along the other side of the control circuit.

8. The semiconductor device of claim 6, wherein at least one of a resistance element and a capacitor element is provided in a region of the control circuit adjacent to the output circuit, and potential of the region is set equal to potential of a power source or a ground.

9. The semiconductor device of claim 2, wherein the output circuit is located between the control circuit and an end part of the semiconductor substrate, and the ground side transistor and the power source side transistor are arranged in a row along the end part of the semiconductor substrate.

10. The semiconductor device of claim 9, wherein the semiconductor substrate is in a rectangular shape, and the pair of the ground side transistor and the power source side transistor includes a plurality of pairs thereof, all of the ground side transistors and the power source side transistors being arranged in a row along one side of the semiconductor substrate.

11. The semiconductor device of claim 9, wherein the output circuit is formed substantially in a rectangular shape on the semiconductor substrate, the control circuit is formed in an L-shape and is arranged so as to be adjacent to two sides of the output circuit, and one of two sides of the control circuit adjacent to the output circuit is adjacent to the power source side transistor while the ground side transistor and the power source side transistor are arranged in a row along the other side of the control circuit.

12. The semiconductor device of claim 9, wherein at least one of a resistance element and a capacitor element is provided in a region of the control circuit adjacent to the output circuit, and potential of the region is set equal to potential of a power source or a ground.

* * * * *